(12) United States Patent
Cheng et al.

(10) Patent No.: US 10,079,280 B2
(45) Date of Patent: Sep. 18, 2018

(54) ASYMMETRIC FET

(71) Applicant: International Business Machines Corporation, Armonk, NY (US)

(72) Inventors: Kangguo Cheng, Schenectady, NY (US); Joseph Ervin, Wappingers Falls, NY (US); Juntao Li, Cohoes, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/685,450

(22) Filed: Aug. 24, 2017

(65) Prior Publication Data

US 2017/0373148 A1    Dec. 28, 2017

Related U.S. Application Data

(62) Division of application No. 15/168,446, filed on May 31, 2016, now Pat. No. 9,859,373, which is a division
(Continued)

(51) Int. Cl.
*H01L 29/08* (2006.01)
*H01L 29/78* (2006.01)
(Continued)

(52) U.S. Cl.
CPC .... *H01L 29/0847* (2013.01); *H01L 21/02532* (2013.01); *H01L 21/02576* (2013.01);
(Continued)

(58) Field of Classification Search
CPC ......... H01L 21/02532; H01L 21/02576; H01L 21/02579; H01L 21/02636;
(Continued)

(56) References Cited

U.S. PATENT DOCUMENTS 6,842,048 B2    1/2005    Krivokapic et al.
6,849,884 B2    2/2005    Clark et al.
(Continued)

OTHER PUBLICATIONS

List of IBM Patents or Patent Applications treated as related dated Aug. 24, 2017, 2 pages.

*Primary Examiner* — Shahed Ahmed
(74) *Attorney, Agent, or Firm* — Scully, Scott, Murphy & Presser, P.C.; Steven J. Meyers

(57) ABSTRACT

After forming a first-side epitaxial semiconductor region and a second-side epitaxial semiconductor region on recessed surfaces of a semiconductor portion that are not covered by a gate structure, at least one dielectric layer is formed to cover the first-side and the second-side epitaxial semiconductor regions and the gate structure. A second-side contact opening is formed within the at least one dielectric layer to expose an entirety of the second-side epitaxial semiconductor region. The exposed second-side epitaxial semiconductor region can be replaced by a new second-side epitaxial semiconductor region having a composition different from the first-side epitaxial semiconductor region or can be doped by additional dopants, thus creating an asymmetric first-side epitaxial semiconductor region and a second-side epitaxial semiconductor region. Each of the first-side epitaxial semiconductor region and the second-side epitaxial semiconducting region can function as either a source or a drain for a transistor.

20 Claims, 10 Drawing Sheets

Related U.S. Application Data of application No. 14/645,503, filed on Mar. 12, 2015, now Pat. No. 9,391,204.

(51) Int. Cl.

| | |
|---|---|
| *H01L 29/66* | (2006.01) |
| *H01L 29/06* | (2006.01) |
| *H01L 21/3105* | (2006.01) |
| *H01L 21/306* | (2006.01) |
| *H01L 29/167* | (2006.01) |
| *H01L 29/165* | (2006.01) |
| *H01L 21/02* | (2006.01) |
| *H01L 23/535* | (2006.01) |
| *H01L 23/528* | (2006.01) |
| *H01L 29/739* | (2006.01) |
| *H01L 23/485* | (2006.01) |

(52) U.S. Cl.
CPC .. *H01L 21/02579* (2013.01); *H01L 21/02636* (2013.01); *H01L 21/30604* (2013.01); *H01L 21/31053* (2013.01); *H01L 23/528* (2013.01); *H01L 23/535* (2013.01); *H01L 29/0649* (2013.01); *H01L 29/083* (2013.01); *H01L 29/165* (2013.01); *H01L 29/167* (2013.01); *H01L 29/66356* (2013.01); *H01L 29/66636* (2013.01); *H01L 29/66659* (2013.01); *H01L 29/66795* (2013.01); *H01L 29/7391* (2013.01); *H01L 29/785* (2013.01); *H01L 29/7835* (2013.01); *H01L 23/485* (2013.01); *H01L 29/7848* (2013.01); *H01L 2924/0002* (2013.01)

(58) Field of Classification Search
CPC ......... H01L 21/30604; H01L 21/31053; H01L 23/528; H01L 23/535; H01L 29/0649; H01L 29/0847; H01L 29/165; H01L 29/167; H01L 29/66636
USPC ......... 257/288, 368, 369; 438/151, 197, 199
See application file for complete search history.

(56) References Cited

U.S. PATENT DOCUMENTS

| | | | |
|---|---|---|---|
| 7,612,420 | B2 | 11/2009 | Lenoble |
| 7,737,501 | B2 | 6/2010 | Zhu et al. |
| 8,138,030 | B2 | 3/2012 | Chang et al. |
| 8,263,446 | B2 | 9/2012 | Cheng et al. |
| 8,299,564 | B1 | 10/2012 | Wu et al. |
| 8,395,220 | B2 | 3/2013 | Chang et al. |
| 8,580,667 | B2 | 11/2013 | Lui et al. |
| 8,603,881 | B1 | 12/2013 | Alptekin et al. |
| 9,490,345 | B2 * | 11/2016 | Chen .................. H01L 29/0847 |
| 2005/0082573 | A1 | 4/2005 | Williford |
| 2006/0043498 | A1 | 3/2006 | Orlowski et al. |
| 2011/0024801 | A1 * | 2/2011 | Cheng .................. H01L 29/165 257/255 |
| 2011/0095333 | A1 | 4/2011 | Park et al. |
| 2011/0108918 | A1 | 5/2011 | Yin et al. |
| 2011/0156107 | A1 | 6/2011 | Bohr et al. |
| 2011/0254080 | A1 | 10/2011 | Doris et al. |
| 2012/0074482 | A1 | 3/2012 | Jung et al. |
| 2013/0214352 | A1 | 8/2013 | Chen |
| 2014/0048846 | A1 | 2/2014 | Lui et al. |
| 2015/0171186 | A1 | 6/2015 | Yin et al. |
| 2015/0318282 | A1 | 11/2015 | Rodder et al. |

\* cited by examiner

ASYMMETRIC FET

BACKGROUND

The present application relates to semiconductor structures, and more particularly to field effect transistor (FET) structures having asymmetric source and drain regions, and methods of manufacturing the same.

Standard FETs, as fabricated and used presently in the art, are symmetric devices in which source and drain regions are interchangeable. The source region and drain region in standard FETs have a same junction profile and are of a same conductivity type, either both n-type for n-type FETs (nFETs), or both p-type for p-type FETs (pFETs). Performance and radio frequency (RF) of classical FETs can be greatly enhanced by forming FETs with asymmetric source regions and drain regions. For example, tunnel FETs (TFETs) in which the source region and drain region are of different conductivity type are good candidates for low power integrated circuit applications due to their steep subthreshold slopes, normally below 60 mV/decade. In other instances, by providing an asymmetric design in source/drain junctions, the device performance of metal oxide semiconductor field effect transistors (MOSFETs) can also be significantly enhanced. In such an asymmetric design, more junction overlap on the source side may be created to reduce on-resistance ($R_{on}$). Simultaneously, the dopant profile at the drain side may be adjusted to obtain a reduced overlap, thereby reducing parasitic capacitance.

Fabrication of FETs with asymmetric source regions and drain regions is challenging because additional masks are needed in order to form source regions and drain regions separately, thus adding process complexity. As such, new fabrication methods are needed to reduce the process complexity in manufacturing the FETs with asymmetric source regions and drain regions.

SUMMARY

The present application provides methods for fabricating FETs with asymmetric source regions and drain regions. After forming a first-side epitaxial semiconductor region and a second-side epitaxial semiconductor region on recessed surfaces of a semiconductor portion that are not covered by a gate structure, at least one dielectric layer is formed to cover the first-side and the second-side epitaxial semiconductor regions and the gate structure. A second-side contact opening is formed within the at least one dielectric layer to expose an entirety of the second-side epitaxial semiconductor region. The exposed second-side epitaxial semiconductor region can be replaced by a new second-side epitaxial semiconductor region having a composition different from the first-side epitaxial semiconductor region or can be doped by additional dopants, thus creating an asymmetric first-side epitaxial semiconductor region and a second-side epitaxial semiconductor region. Each of the first-side epitaxial semiconductor region and the second-side epitaxial semiconducting region can function as either a source or a drain for a FET. In the present application, the asymmetric source regions and drain regions (collectively, referred to as "source/drain regions") are formed at a later fabrication stage when the source/drain contact structures are formed, the process complexity in the fabrication of the FET with symmetric source/drain regions is thus reduced.

In one aspect of the present application, a method of forming a semiconductor structure is provided.

In one embodiment, the method includes forming a first-side trench on a first side of a gate structure and a second-side trench on a second side of the gate structure opposite the first side by recessing portions of a semiconductor portion located on a substrate. Next, a first-side epitaxial semiconductor region is formed in the first-side trench and a sacrificial second-side epitaxial semiconductor region is formed in the second-side trench. The first-side epitaxial semiconductor region and the sacrificial second-side epitaxial semiconductor region have a first composition. At least one dielectric layer is then formed over the first-side epitaxial semiconductor region, the sacrificial second-side epitaxial semiconductor region and the gate structure. After forming a second-side contact opening through the at least one dielectric layer to expose an entirety of the sacrificial second-side epitaxial semiconductor region while the first-side epitaxial semiconductor region remains covered by the at least one dielectric layer, the sacrificial second-side epitaxial semiconductor region is removed to expose the second-side trench. Next, a second-side epitaxial semiconductor region is formed in the second-side trench. The second-side epitaxial semiconductor region has a second composition different from the first composition.

In another embodiment, the method includes forming a first-side trench on a first side of a gate structure and a second-side trench on a second side of the gate structure opposite the first side by recessing portions of a semiconductor portion located on a substrate. Next, a first-side epitaxial semiconductor region is formed in the first-side trench and a second-side epitaxial semiconductor region is formed in the second-side trench. The first-side epitaxial semiconductor region and the second-side epitaxial semiconductor region comprise dopants of a first conductivity type. After forming at least one dielectric layer over the first-side epitaxial semiconductor region, the second-side epitaxial semiconductor region and the gate structure, a second-side contact opening is formed through the at least one dielectric layer to expose an entire top surface of the second-side epitaxial semiconductor region while the first-side epitaxial semiconductor region remains covered by the at least one dielectric layer. Next, dopants are added to the second-side epitaxial semiconductor region and a portion of the semiconductor portion surrounding the second-side epitaxial semiconductor region. The dopants have a conductivity type the same as or opposite the first conductivity type.

In another aspect of the present application, a semiconductor structure is provided. The semiconductor structure includes a gate structure comprising a gate stack located over a channel portion of a semiconductor portion and a gate spacer located on each sidewall of the gate stack. The semiconductor portion is provided on a substrate. The semiconductor structure further includes a first epitaxial source/drain region located on a recessed surface of the semiconductor portion and adjoined to a first side of the gate structure, and a second epitaxial source/drain region located at least on another recessed surface of the semiconductor portion and adjoined to a second side of the gate structure opposite the first side.

DETAILED DESCRIPTION

Figure 1:
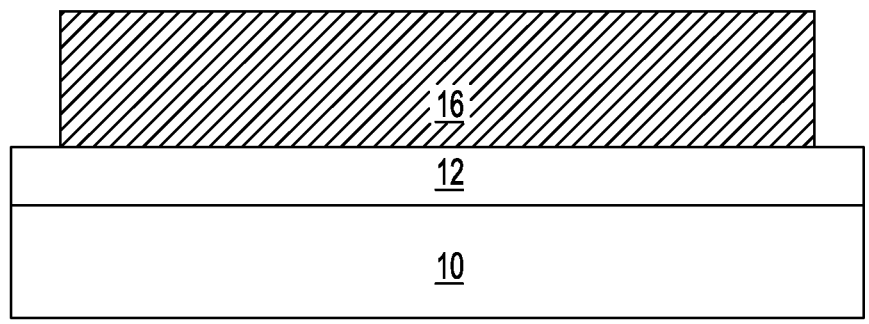
FIG. 1 is a cross-sectional view of a first exemplary semiconductor structure including a substrate and a semiconductor fin formed thereon according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form asymmetric source/drain regions in FinFETs, the basic concept of the present application can be applied to form asymmetric source/drain regions in planar FETs as well.

Referring to FIG. 1, a first exemplary semiconductor structure that can be employed in a first embodiment of the present application includes a substrate and at least one semiconductor fin 16 formed thereon. In some embodiments of the present application, the at least one semiconductor fin 16 can be formed by patterning a top semiconductor layer of a semiconductor-on-insulator (SOI) substrate. In other embodiments, the at least one semiconductor fin 16 can be formed by patterning an upper portion of a bulk semiconductor substrate.

In one embodiment of the present application and as shown in FIG. 1, the substrate is an SOI substrate including, from bottom to top, a handle substrate 10, a buried insulator layer 12 and a top semiconductor layer (not shown) from which the at least one semiconductor fin 16 is formed.

The handle substrate 10 may include a semiconductor material, such as, for example, Si, Ge, SiGe, Si:C, SiGe:C, a compound semiconductor material such as a III-V compound semiconductor material or a II-VI compound semiconductor material, or a combination thereof. In one embodiment, the handle substrate 10 is composed of single crystalline silicon. The thickness of the handle substrate 10 can be from 50 μm to 2 mm, although lesser and greater thicknesses can also be employed.

The buried insulator layer 12 may include a dielectric material such as silicon oxide, silicon nitride, silicon oxynitride, or a combination thereof. In one embodiment, the buried insulator layer 12 may be formed by a deposition process, such as chemical vapor deposition (CVD) or physically vapor deposition (PVD). In another example, the buried insulator layer 12 may be formed using a thermal growth process, such as thermal oxidation, to convert a surface portion of the handle substrate 10. The thickness of the buried insulator layer 12 that is formed can be from 50 nm to 200 nm, although lesser or greater thicknesses can also be employed.

The top semiconductor layer can include a semiconductor material such as, for example, Si, Ge, SiGe, SiC, SiGeC, and III/V compound semiconductors such as, for example, InAs, GaAs, and InP. The semiconductor materials of the top semiconductor layer and the handle substrate 10 may be the same or different. In one embodiment, the top semiconductor layer includes a single crystalline semiconductor material, such as, for example, single crystalline silicon. The top semiconductor layer may be doped with n-type dopants or p-type dopants. In one embodiment, the dopants may be p-type dopants including, but not limited to, boron, aluminum, gallium and indium. In another embodiment, the dopants may be n-type dopants including, but not limited to, antimony, arsenic and phosphorous. The top semiconductor layer may be formed by a deposition process, such as CVD or plasma enhanced CVD (PECVD). The top semiconductor layer that is formed may have a thickness from 10 nm to 200 nm, although lesser or greater thicknesses can also be employed.

Optionally, a pad layer (not shown) which may be comprised of silicon nitride or a bilayer comprised of a silicon nitride layer and an underlying silicon oxide layer can be deposited on the top semiconductor layer. The pad layer, when present, protects the top semiconductor layer during the subsequent patterning processes for forming the at least one semiconductor fin 16.

The at least one semiconductor fin 16 can be formed by lithography and etching of the top semiconductor layer of the SOI substrate. The lithographic step includes applying a photoresist layer (not shown) atop the top semiconductor layer or the pad layer, if present, exposing the photoresist layer to a desired pattern of radiation, and developing the exposed photoresist layer utilizing a conventional resist developer. The etching process may comprise a dry etch, a wet chemical etching process, or a combination thereof. Suitable dry etching processes that can be used in the present application include, but are not limited to, reactive ion etching, ion beam etching, plasma etching or laser ablation. Typically, a RIE process is used. The etching process transfers the pattern from the patterned photoresist layer to the top semiconductor layer or first to the pad layer, if present, and thereafter to the underlying top semiconductor layer utilizing the buried insulator layer 12 as an etch stop. After transferring the pattern into the top semiconductor layer, the patterned photoresist layer can be removed utilizing a conventional resist stripping process such as, for example, ashing. The remaining portion of the top semiconductor layer after the lithographic patterning constitutes the semiconductor fin 16. Alternatively, the at least one semiconductor fin 16 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins 16 have been formed.

In some embodiments of the present application and when the pad layer is present, a portion of the pad layer that remains atop the semiconductor fin 16 can be removed at this stage. The removal of the remaining non-etched portion of pad layer can be achieved by performing a selective etching process or by utilizing a planarization process such as chemical mechanical planarization (CMP).

Figure 2:
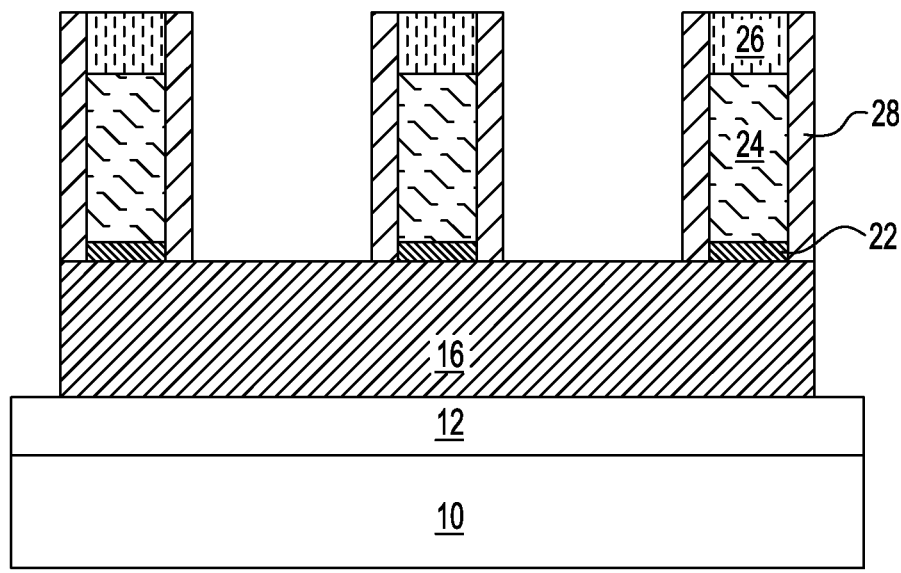
FIG. 2 is a cross-sectional view of the first exemplary semiconductor structure of FIG. 1 after forming gate structures over the semiconductor fin.

Referring to FIG. 2, gate stacks (22, 24, 26) are formed on (and straddle) a channel portion of the semiconductor fin 16 by deposition and patterning of gate stack layers. The patterning of the gate stack layers can be effected by application of a photoresist layer (not shown), lithographic patterning of the photoresist layer, transfer of the pattern in the photoresist layer into the gate stack layers, and removal of the patterned photoresist layer, for example, by ashing. Alternatively, any other suitable patterning techniques such as sidewall imaging transfer can be used to pattern the gate stack layers. Each gate stack (22, 24, 26) includes at least a gate dielectric 22 and a gate electrode 24. Each gate stack (22, 24, 26) may optionally include a gate cap 26. In one embodiment, the materials of the gate stacks (22, 24, 26) can be sacrificial materials that are subsequently removed, and are replaced with another gate stack including a functional gate dielectric and a functional gate electrode after doped epitaxial semiconductor material is formed that provides the source and drain regions of the semiconductor structure.

The gate dielectric 22 can include silicon oxide, silicon nitride, silicon oxynitride, or a combination thereof. Alternately or additionally, the gate dielectric 22 can include a high dielectric constant (high-k) dielectric material having a dielectric constant greater than 8.0. Exemplary high-k dielectric materials include, but are not limited to, $HfO_2$, $ZrO_2$, $La_2O_3$, $Al_2O_3$, $TiO_2$, $SrTiO_3$, $LaAlO_3$ or $Y_2O_3$. The gate dielectric 22 can have a thickness from 1 nm to 10 nm, although lesser and greater thicknesses can also be employed.

The gate electrode 24 includes at least one conductive material. Conductive materials that can be employed for the gate electrode 24 include, but are not limited to, doped semiconductor materials such as, for example, doped polysilicon and metallic materials such as, for example, tungsten, titanium, tantalum, aluminum, nickel, ruthenium, palladium, platinum, or alloys thereof. The gate electrode 24 can have a thickness from 10 nm to 100 nm, although lesser and greater thicknesses can also be employed.

The gate cap 26, if employed, can be comprised of a dielectric material including, for example, silicon oxide, silicon nitride, silicon oxynitride, dielectric, or multilayer stacks thereof. When present, the gate cap 26 can have a thickness from 20 to 100 nm, although lesser and greater thicknesses can also be employed.

Gate spacers 28 can be formed on sidewalls of gate stacks (22, 24, 26). The gate spacers 28 can be formed, for example, by deposition of a conformal dielectric material layer and selective removal of horizontal portions of the deposited conformal dielectric material layer. The remaining vertical portions of the deposited conformal dielectric material layer constitute the gate spacers 28. The gate spacers 28 may be composed of a dielectric material such as, for example, silicon oxide, silicon nitride, silicon oxynitride, and combinations thereof. The width of the gate spacer 28, as measured at the base, can be from 2 nm to 50 nm, although lesser and greater widths can also be employed.

Each gate stack (22, 24, 26) and gate spacers 28 that laterally surrounds the gate stack (22, 24, 26) constitutes a gate structure (22, 24, 26, 28).

Figure 3:
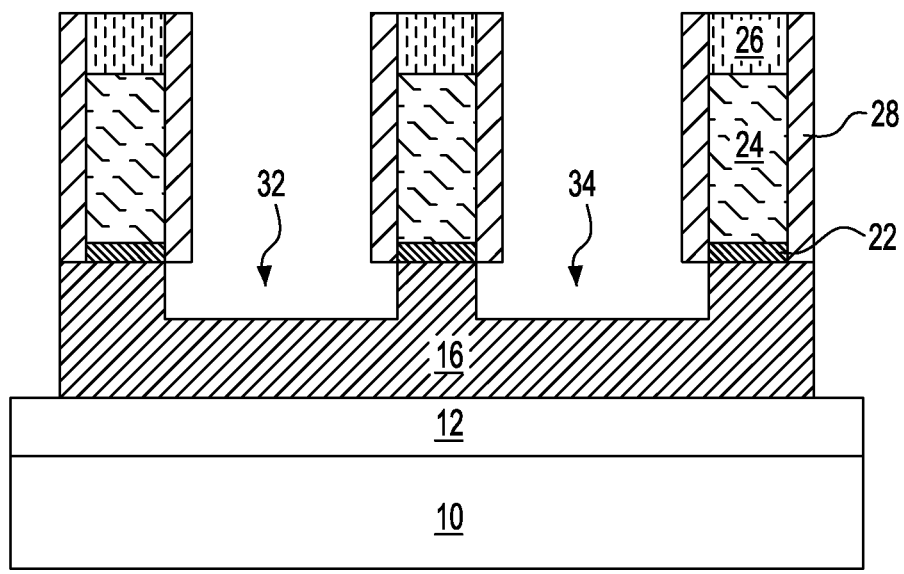
FIG. 3 is a cross-sectional view of the first exemplary semiconductor structure of FIG. 2 after forming a first trench and a second trench in portions of the semiconductor fin located between the gate structures.

Referring to FIG. 3, a first trench 32 and a second trench 34 are formed in portions of the semiconductor fin 16 located between the gate structures (22, 24, 26, 28). Each of the first trench 32 and the second trench 34 has a trench bottom surface located between the top surface and the bottom surface of the semiconductor fin 16. Each of the first trench 32 and the second trench 34 has sidewalls laterally offset from the outer sidewalls of the gate spacers 28. In one embodiment and as shown in FIG. 3, sidewalls of the first trench 32 and the second trench 34 are vertically coincident with inner sidewalls of the gate spacers 28. The sidewalls of the first trench 32 and second trench 34 allows the formation of sharp, well defined junctions between the channel portion of a transistor and source/drain regions subsequently formed.

The first trench 32 and the second trench 34 may be formed by first vertically recessing portions of the semiconductor fin 16 that are not covered by the gate structures (22, 24, 26, 28) by an anisotropic etch. The anisotropic etch removes semiconductor material of the semiconductor fin 16 selective to the dielectric materials of the gate caps 26 and the gate spacers 28. The anisotropic etch can be a dry etch such as reactive ion etch (RIE) or a wet etch such as ammonia etching. Subsequently, an isotropic etch is performed to laterally etch portions of the semiconductor fin 16 that are located beneath the gate structure (22, 24, 26, 28). The isotropic etch can be a dry etch such as, for example a chemical dry etch containing chlorine that allows a precise control of the lateral undercut.

Figure 4:
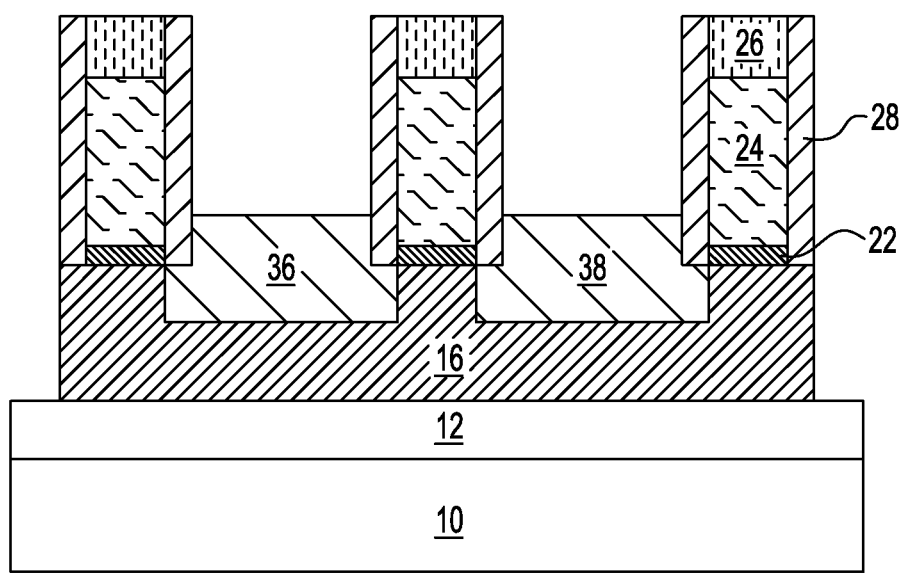
FIG. 4 is a cross-sectional view of the first exemplary semiconductor structure of FIG. 3 after forming a first-side epitaxial semiconductor region in the first trench and a second-side epitaxial semiconductor region in the second trench.

Referring to FIG. 4, a semiconductor material is selectively deposited in the first trench 32 and the second trench 34 to provide a first-side epitaxial semiconductor region 36 and a second-side epitaxial semiconductor region 38. In the first embodiment of the present application, the second-side epitaxial semiconductor region 38 is a sacrificial region and is replaced with another second-side epitaxial semiconductor region in a later processing step. In one embodiment and as shown in FIG. 4, top surfaces of the first-side epitaxial semiconductor region 36 and the second-side epitaxial semiconductor region 38 are located above the top surface of the semiconductor fin 16. The deposition of the semiconductor material can be effected, for example, by a selective epitaxy process. During the selective deposition of the semiconductor material, the semiconductor material is deposited on semiconductor surfaces of the semiconductor fin 16, and is not deposited on dielectric surfaces such as the surfaces of the gate caps 26 and the gate spacers 28. The doping of the first-side epitaxial semiconductor region 36 and the second-side epitaxial semiconductor region 38 can be formed in-situ during the epitaxial growth of the semiconductor material. Alternatively, the doping of the first-side epitaxial semiconductor region 36 and the second-side epitaxial semiconductor region 38 can be formed after the epitaxial growth of the semiconductor material by ion implantation, gas phase doping or out diffusion of a dopant from a sacrificial material layer include said doping.

The semiconductor materials of the first-side epitaxial semiconductor region 36 and the second-side epitaxial semiconductor region 38 can be selected from, but are not limited to, silicon, silicon germanium, silicon carbon, silicon germanium carbon, a compound semiconductor material, or an alloy thereof. The first-side epitaxial semiconductor region 36 and the second-side epitaxial semiconductor region 38 are doped with dopants having a conductivity type opposite the conductivity type of the semiconductor fin. In one embodiment, the first-side epitaxial semiconductor region 36 and the second-side epitaxial semiconductor region 38 have a p-type conductivity and are composed of boron-doped silicon germanium.

Figure 5:
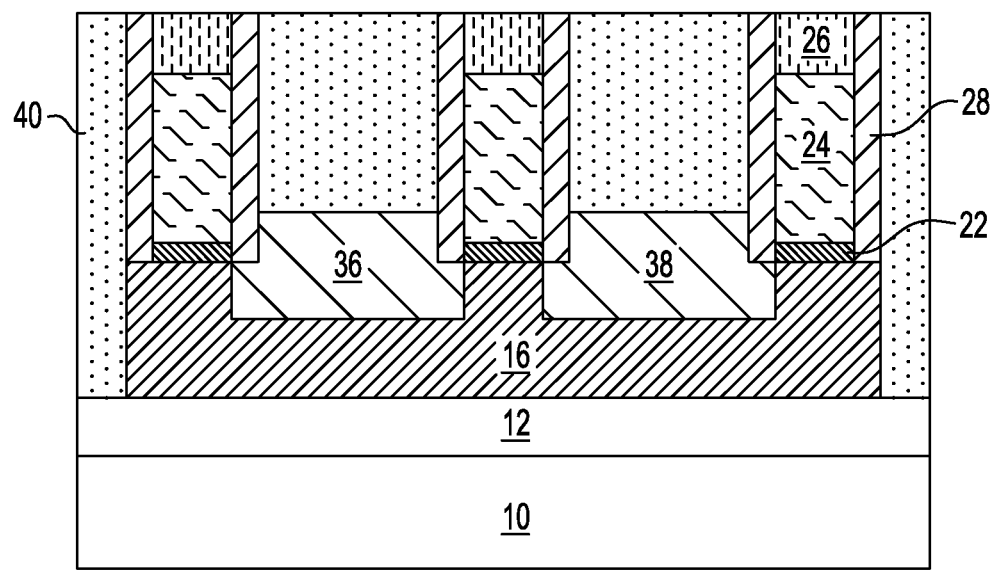
FIG. 5 is a cross-sectional view of the first exemplary semiconductor structure of FIG. 4 after forming an interlevel dielectric (ILD) layer over the gate structures, the first-side epitaxial semiconductor region, the second-side epitaxial semiconductor region and the substrate.

Referring to FIG. 5, an interlevel dielectric (ILD) layer 40 is formed over the gate structures (22, 24, 26, 28), the first-side epitaxial semiconductor region 36, the second-side epitaxial semiconductor region 38 and exposed surfaces of buried insulator layer 12 of the substrate. The ILD layer 40 may include a dielectric material that can be easily planarized. For example, the ILD layer 40 can include a doped silicate glass, an undoped silicate glass (silicon oxide), an organosilicate glass, a porous dielectric material, or amorphous carbon. The ILD layer 40 can be deposited using a conventional deposition process, such as, for example, CVD, PECVD, PVD or spin coating. The ILD layer 40 can be subsequently planarized, for example, by CMP. In one embodiment and as shown in FIG. 5, the ILD layer 40 is planarized using the topmost surface of the gate structure (22, 24, 26, 28) as an etch stop such that the top surface of the ILD layer 40 is coplanar with the topmost surfaces of the gate structures (22, 24, 26, 28), i.e., the top surfaces of the gate caps 26.

Figure 6:
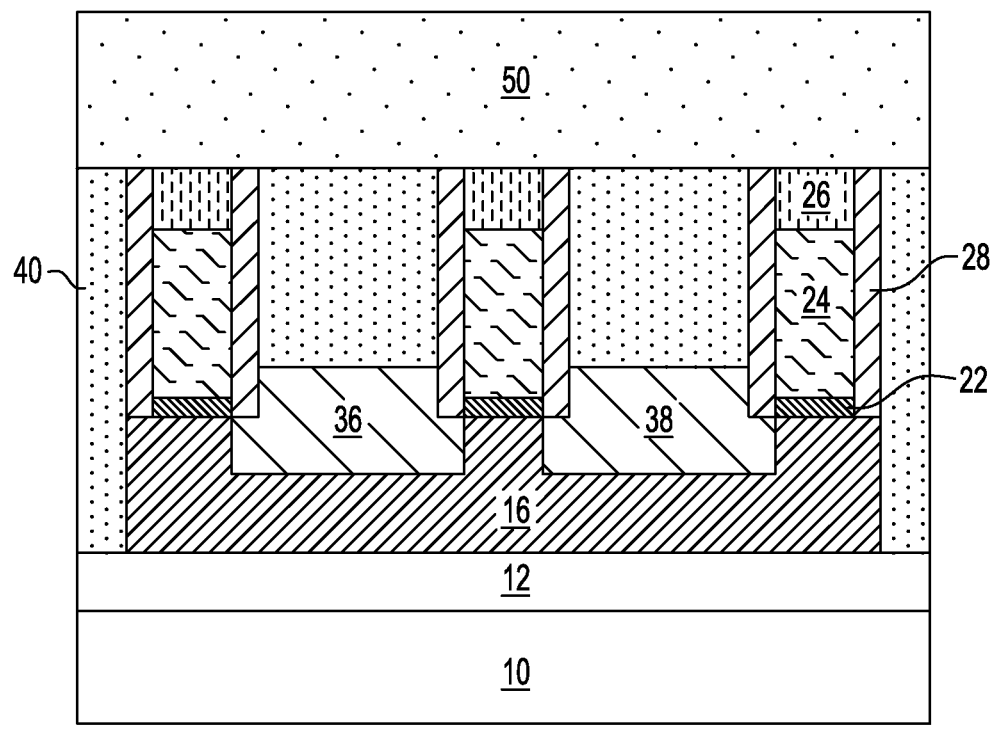
FIG. 6 is a cross-sectional view of the first exemplary semiconductor structure of FIG. 5 after forming a contact level dielectric layer over the gate structures and the ILD layer.

Referring to FIG. 6, an optional contact level dielectric layer 50 is formed over the gate structures (22, 24, 26, 28) and the ILD layer 40. The contact level dielectric layer 50 includes a dielectric material such as silicon oxide, silicon nitride, organosilicate glass, or a combination thereof. In some embodiments, the contact level dielectric layer 50 may include a dielectric material that is the same as the dielectric material of the ILD layer 40. The contact level dielectric layer 50 can be formed by CVD, PECVD, PVD or spin coating. If the contact level dielectric layer 50 is not self-planarizing, the top surface of the contact level dielectric layer 50 can be planarized, for example, by CMP. The planarized top surface of the contact level dielectric layer 50 is located above the topmost surfaces of the gate structures (22, 24, 26, 28).

Figure 7:
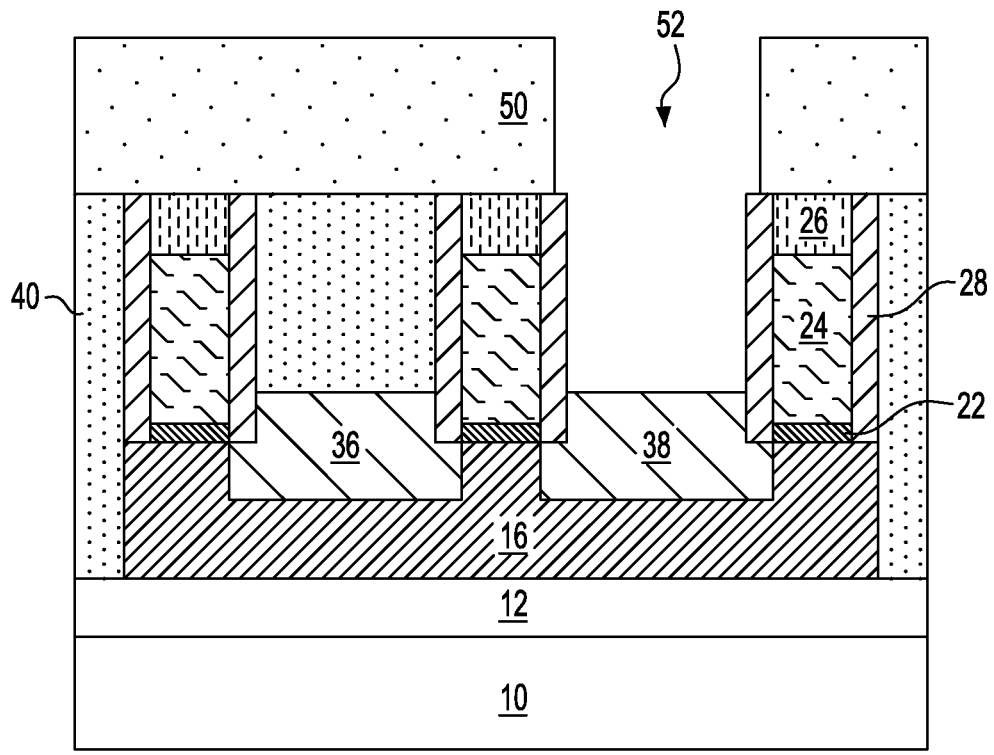
FIG. 7 is a cross-sectional view of the first exemplary semiconductor structure of FIG. 6 after forming a second-side contact opening extending through the contact level dielectric layer and the ILD layer to expose an entirety of the second-side epitaxial semiconductor region.

Referring to FIG. 7, a second-side contact opening 52 is formed extending through the contact level dielectric layer 50 and the ILD layer 40 to expose an entirety of the second-side epitaxial semiconductor region 38. In one embodiment, the second-side contact opening 52 also exposes portions of the gate spacers 28 laterally surrounding the second-side epitaxial semiconductor region 38, thus is self-aligned. In another embodiment, the second-side contact opening 52 is formed within the ILD layer 40 if the contact level dielectric layer 50 is not present (not shown). The second-side contact opening 52 can be formed by applying a mask layer (not shown) over the contact level dielectric layer 50, and then patterning the mask layer to form an opening therein. In one embedment, the mask layer can be a photoresist layer or a photoresist layer in conjunction with hard mask layer(s). The pattern of the opening in the mask layer is transferred through the contact level dielectric layer 50 and the ILD layer 40 to form the second-side contact opening 52. An anisotropic etch such as RIE can be performed to remove the dielectric materials of the contact level dielectric layer 50 and the ILD layer 40 selective to the semiconductor material of the second-side epitaxial semiconductor region 38 and the dielectric material of the gate spacers 28. After forming the second-side contact opening 52, the remaining mask layer can be removed by oxygen-based plasma etching.

Figure 8:
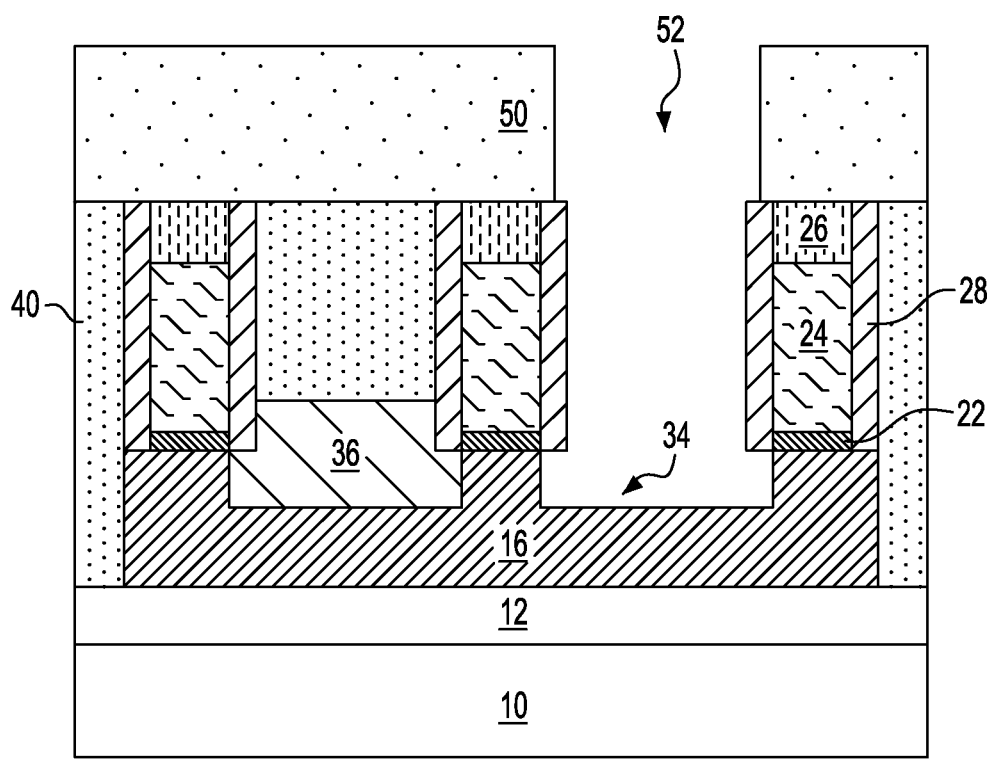
FIG. 8 is a cross-sectional view of the first exemplary semiconductor structure of FIG. 7 after removing the second-side epitaxial semiconductor region from the second trench.

Referring to FIG. 8, the second-side epitaxial semiconductor region 38 is removed from the second trench 34 employing an etch chemistry that etches the semiconductor material of the second-side epitaxial semiconductor region 38 selective to the semiconductor material of the semiconductor fin 16 and the dielectric materials of the gate spacers 28 and the contact level dielectric layer 50. The removal of the second-side epitaxial semiconductor region 38 re-exposes the bottom surface and sidewalls of the second trench 34.

Figure 9:
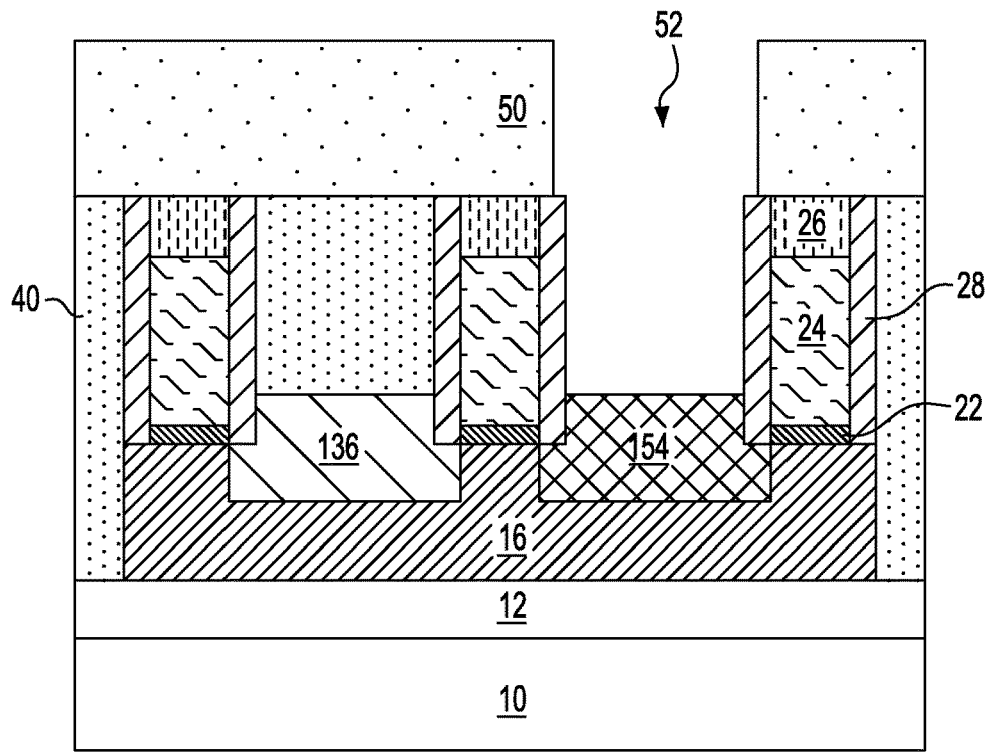
FIG. 9 is a cross-sectional view of the first exemplary semiconductor structure of FIG. 8 after growing a new second-side epitaxial semiconductor region in the second trench.

Referring to FIG. 9, another (i.e., new) second-side epitaxial semiconductor region (not shown) is regrown in the second trench 34 by a selective epitaxy process as described above in FIG. 4. The new second-side epitaxial semiconductor region includes a semiconductor material that is different from the semiconductor material of the first-side epitaxial semiconductor region 36. In one embodiment and when the first-side epitaxial semiconductor region 36 is composed of silicon germanium, the new second-side epitaxial semiconductor region may include silicon. The dopant type of the new second-side epitaxial semiconductor region is opposite the dopant type of the first-side epitaxial semiconductor region 36. For example, if the first-side epitaxial semiconductor region 36 has a p-type conductivity, n-type dopants, such as phosphorus or arsenic, may be added to the new second-side epitaxial semiconductor region. If the first-side epitaxial semiconductor region 36 has an n-type conductivity, p-type dopants, such as boron or indium, may be added to the new second-side epitaxial semiconductor region. In one embodiment and when the first-side epitaxial semiconductor region 36 is composed of boron doped silicon germanium, the new second-side epitaxial semiconductor region may include phosphorous doped silicon or Si:C. The new top surface the second-side epitaxial semiconductor region is located above the top surface of the at least one semiconductor fin 16 and is exposed by the second-side contact opening 52.

Dopants in the first-side epitaxial semiconductor region 36 and the new second-side epitaxial semiconductor region can be subsequently activated, for example, by laser anneal.

The first-side epitaxial semiconductor region 36 becomes a first epitaxial source/drain region 136. The new second-side epitaxial semiconductor region becomes a second epitaxial source/drain region 154. Each of the first epitaxial source/drain region 136 and the second epitaxial source/drain region 154 can be function as either a source or a drain for a FET. Asymmetric source and drain regions are thus obtained because the first-side epitaxial semiconductor region 36 and the new second-side epitaxial semiconductor region are composed of different semiconductor materials and are of different conductivity type. In one embodiment the formed asymmetric FET is a tunnel FET.

Figure 10:
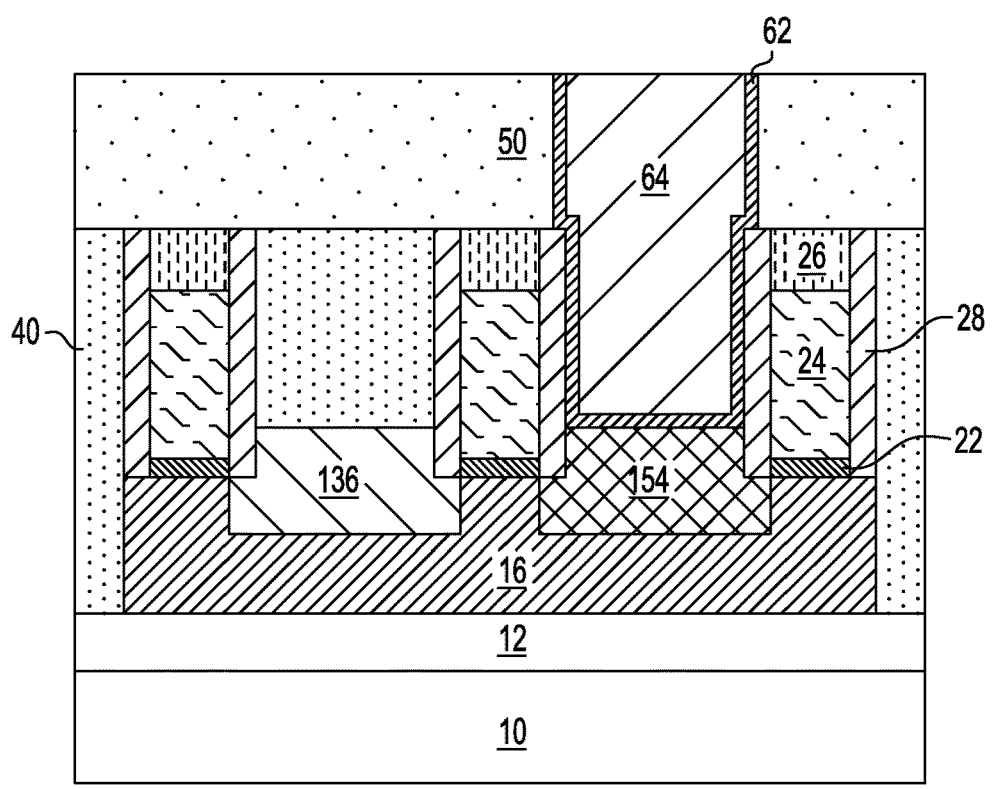
FIG. 10 is a cross-sectional view of the first exemplary semiconductor structure of FIG. 9 after forming a second-side contact structure within the second-side contact opening.

Referring to FIG. 10, a second-side contact structure is formed within the second-side contact opening 52 contacting an entire top surface of the second epitaxial source/drain region 154. The second-side contact structure includes a second-side contact liner 62 formed on sidewalls and a bottom surface of the second-side contact opening 52 and a second-side contact plug 64 formed over the second-side contact liner 62. The second-side contact structure (62, 64) may be formed by first depositing a conformal contact liner material layer (not shown) on the sidewalls and the bottom surface of the second-side contact opening 52 and the top surface of the contact level dielectric layer 50. In one embodiment, the bottom portion of the contact liner material layer that is in contact with the second epitaxial source/drain region 154 may react with the semiconductor material in the second epitaxial source/drain region 154 to form a second-side metal semiconductor liner portion (not shown) such as silicide directly on top of the second epitaxial source/drain region 154. The second-side metal semiconductor liner portion reduces contact resistance between the second epitaxial source/drain region 154 and the contact plug 66 subsequently formed.

The contact liner material layer may titanium, titanium nitride, tantalum, tantalum nitride, nickel, platinum, cobalt, tungsten, rhenium, palladium, erbium, hafnium, lanthanum, and their alloys, such as nickel platinum (NiPt) and titanium platinum (TiPt). The choice of the liner materials depends on the types of dopants in the second epitaxial source/drain region 154. In one embodiment and when the second epitaxial source/drain region 154 is of an n-type conductivity, the contact liner material layer may include titanium. In another embodiment and when the second epitaxial source/drain region 154 is of a p-type conductivity, the contact liner material layer may include NiPt. The contact liner material layer may be formed utilizing a conformal deposition process such as, for example, CVD or atomic layer deposition (ALD). The contact liner material layer that is formed can have a thickness ranging from 1 nm to 15 nm, although lesser and greater thicknesses can also be employed.

A contact material layer (not shown) is deposited in the remaining volume of the second-side contact opening 52 until the second-side contact opening 52 is completely filled. The contact material layer may include a metal such as, for example, tungsten, aluminum, copper or their alloys. The conductive material layer can be formed by any suitable deposition method such as, for example, CVD, PVD or plating.

Portions of the contact liner material layer and the contact material layer that are located above the top surface of the contact level dielectric layer 50 can be subsequently removed by employing a planarization process, such as, for example, CMP. The remaining portion of the contact liner material layer in the second-side contact opening 52 constitutes the second-side contact liner 62, while the remaining portion of the contact material layer in the second-side contact opening 52 constitutes the second-side contact plug 64.

Figure 11:
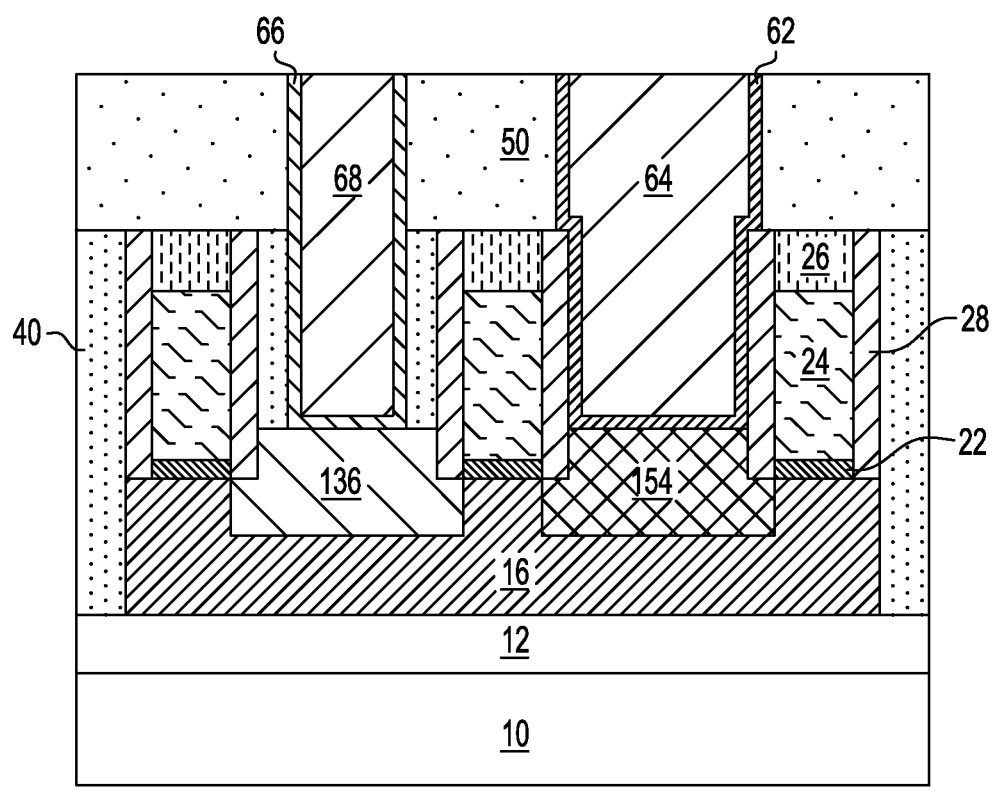
FIG. 11 is a cross-sectional view of the first exemplary semiconductor structure of FIG. 10 after forming a first-side contact structure within a first-side contact opening.

Referring to FIG. 11, a first-side contact structure including a first-side contact liner 66 and a first-side contact plug 68 are formed within the contact level dielectric 50 and the ILD layer 40 and contacting at least a portion of the top surface of the first epitaxial source/drain region 136. The first-side contact structure (66, 68) can be formed by first forming a first-side contact opening (not shown) employing processing steps described above in FIG. 9. In one embodiment, the mask layer employed in the lithographic and patterning processes in the formation of the first-side contact opening covers the second-side contact structure (62, 64). Subsequently, the first-side contact liner 66 is formed on sidewalls and the bottom surface of the first-side contact opening and the first-side contact plug 68 is formed over the first-side contact liner 66 employing processing steps described above in FIG. 10. The first-side contact liner 66 may include a metal different from the metal of the second-side contact liner 62. In one embodiment and when the first epitaxial source/drain region 136 is of an n-type conductivity, the first-side contact liner 66 may include titanium. In another embodiment and when the first epitaxial source/drain region 136 is of an n-type conductivity, the first-side contact liner 66 may include NiPt. The first-side contact plug 68 may include a conductive material that is the same as, or different from, the conductive material of the second-side contact plug 64. In addition, the bottom potion of the first-side contact liner 66 may react with the semiconductor material in the first epitaxial source/drain region 136 to form a first-side metal semiconductor liner portion (not shown) to provide a lower contact resistance for the first epitaxial source/drain region 136.

Figure 12:
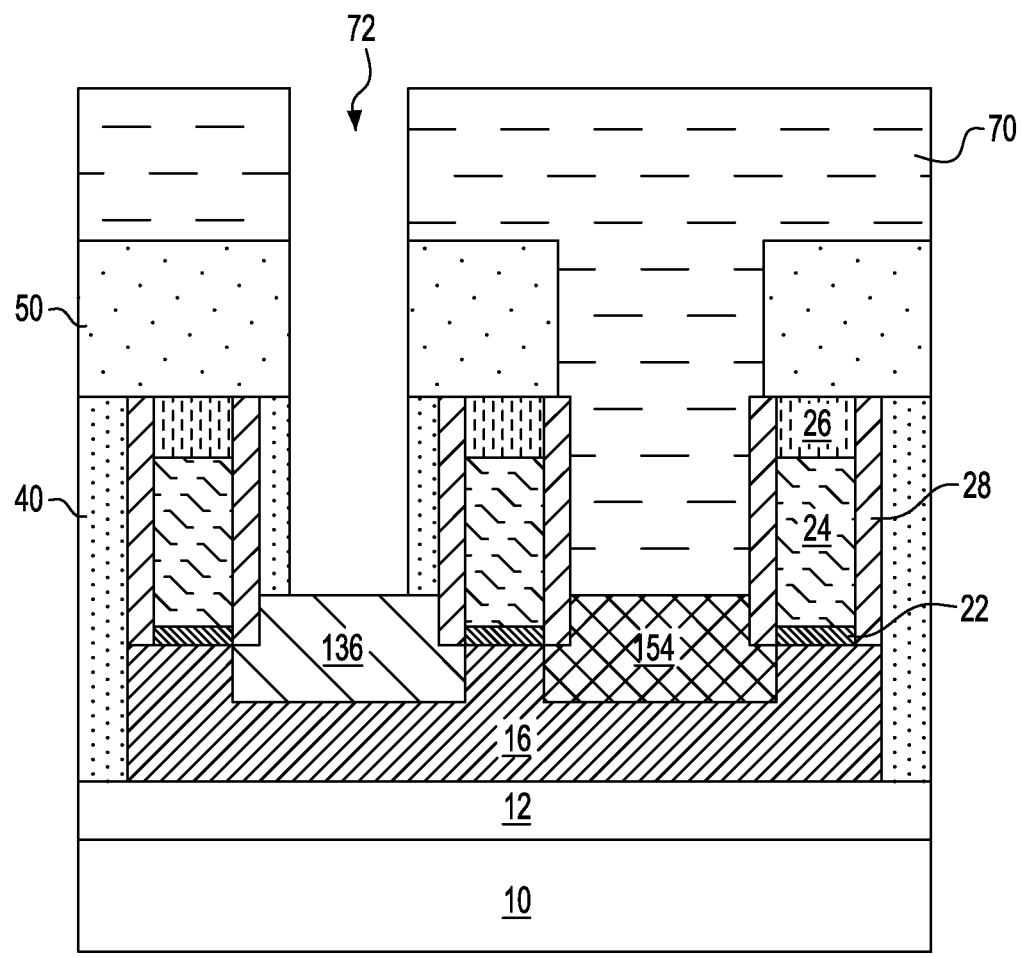
FIG. 12 is a cross-sectional view of a variation of the first exemplary semiconductor structure of FIG. 9 after forming a first-side contact opening through the contact level dielectric layer and the ILD layer to expose at least a portion of the first-side epitaxial semiconductor region while the second-side contact opening is covered by a mask layer.
Figure 13:
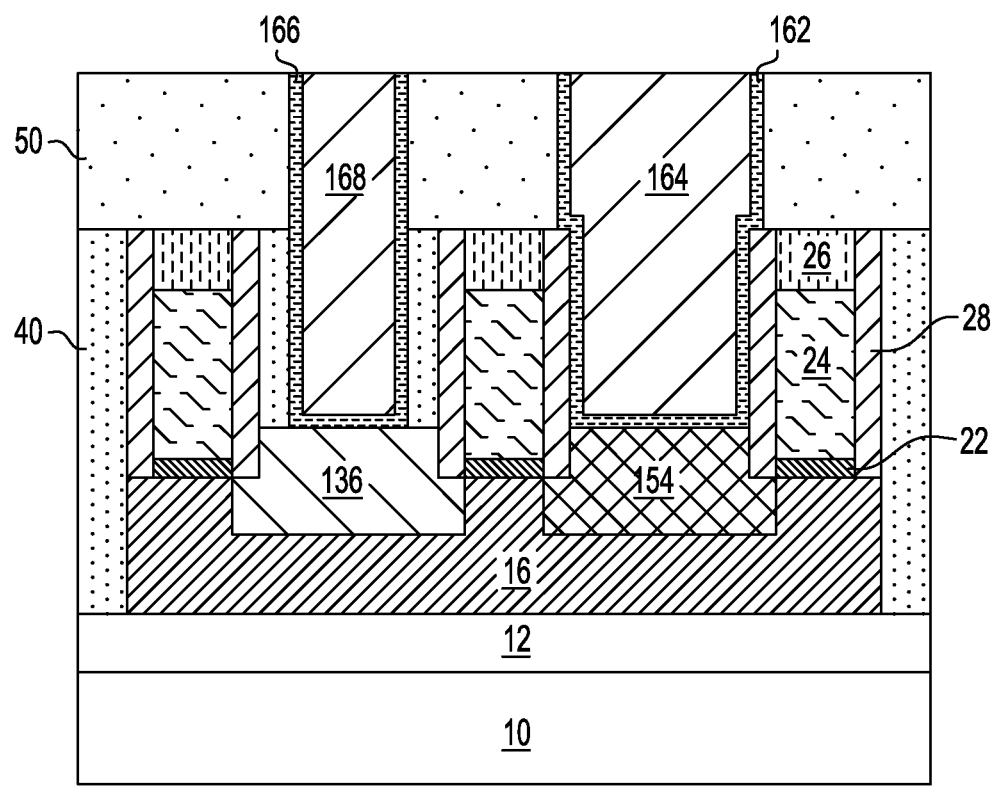
FIG. 13 is a cross-sectional view of the variation of the first exemplary semiconductor structure of FIG. 12 after forming a first-side contact structure within the first-side contact opening and a second-side contact structure within the second-side contact opening.

FIGS. 12-13 depict a variation of the process flow in the formation of the first exemplary semiconductor structure illustrated in FIG. 11 of the present application.

Referring to FIG. 12, after forming the second epitaxial source/drain region 154 in FIG. 9, a first-side contact opening 72 is formed through the contact level dielectric layer 50 and the ILD layer 40 to expose at least a portion of the top surface of the first epitaxial source/drain region 136. The first-side contact opening 72 can be formed by applying a mask layer 70 over the contact level dielectric layer 50 and the second-side contact opening 52 and then lithographically patterning the mask layer 70 to form an opening. The mask layer 70 can be a photoresist layer or a photoresist layer in conjunction with hard mask layer(s). The opening overlies the first epitaxial source/drain region 136. In some embodiments of the present application, the opening may overlie portions of the gate spacer 28 laterally surrounding the first epitaxial source/drain region 136 (not shown). The pattern of the opening in the mask layer 70 is transferred through the contact level dielectric layer 50 and the ILD layer 40 to form the first-side contact opening 72 by an anisotropic etch. The anisotropic etch can be a dry etch such as, for example, RIE, or a wet etch that removes the dielectric materials of the contact level dielectric layer 50 and the ILD layer 40 selective to the semiconductor material of the first epitaxial source/drain region 136. After forming the first-side contact opening 72, the remaining mask layer 70 can be removed by oxygen-based plasma etching. The removal of the mask layer 70 re-exposes second-side contact opening 52 and the second epitaxial source/drain region 154 located underneath the second-side contact opening 52.

Referring to FIG. 13, a first-side contact structure including a first-side contact liner 166 and a s first-side contact plug 168 is formed within the first-side contact opening 72 and a second-side contact structure including a second-side contact liner 162 and a second-side contact plug 164 is formed within the second-side contact opening 52 employing the processing steps described above in FIG. 10. For example, a conformal contact liner material layer (not shown) can be deposited on the sidewalls and the bottom surfaces of the first-side and the second-side contact openings 72, 52 and the top surface of the contact level dielectric layer 50. A contact material layer (not shown) is then deposited in the remaining volume of the first-side and the second-side contact openings 72, 52 until the first-side and the second-side contact openings 72, 52 are completely filled. Subsequently, portions of the contact liner material layer and the contact conductor layer that are located above the topmost surface of the contact level dielectric layer 50 to provide the first-side contact structure (166, 168) and the second-side contact structure (162, 164). The first-side contact liner 166 and the second-side contact liner 162 thus formed include a same conductive material. Similarly, the first-side contact plug 168 and the second-side contact plug 164 thus formed include a same conductive material.

Figure 14:
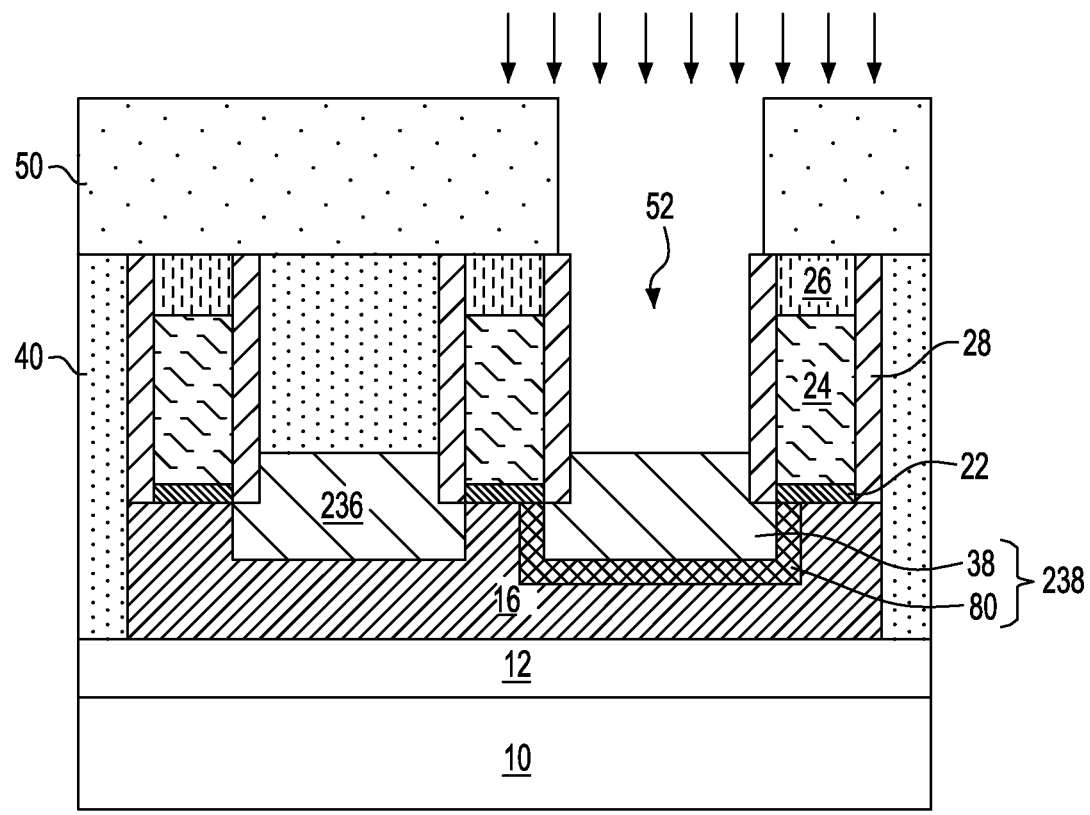
FIG. 14 is a cross-sectional view of a second exemplary semiconductor structure that can be derived from the first exemplary structure of FIG. 7 after implanting dopants of a same conductivity type as the dopants in the second-side epitaxial semiconductor region into the second-side epitaxial semiconductor region and a portion of the semiconductor fin surrounding the second-side epitaxial semiconductor region.

Referring to FIG. 14, a second exemplary semiconductor structure according to a second embodiment of the present application can be derived from the first exemplary semiconductor structure of FIG. 7 by implanting dopants into the second-side epitaxial semiconductor region 38 and a portion of the semiconductor fin 16 surrounding the second-side epitaxial semiconductor region 38 through the second-side contact opening 52. The doped portion of the semiconductor fin 16 surrounding the second-side epitaxial semiconductor region 38 is herein referred to as a dopant portion 80.

Ion implantation may be performed to provide additional, i.e., extra, dopants to the second-side epitaxial semiconductor region 38 and the portion of the semiconductor fin 16 surrounding the second-side epitaxial semiconductor region 38. In one embodiment, the implantation is performed at an angle from 60° to 85° relative to the top surface of the second-side epitaxial semiconductor region 38, although lesser and greater angles can also be employed. In one embodiment, the implanted ions are dopants having the same doping type as the first-side epitaxial semiconductor region 36 and the second-side epitaxial semiconductor region 38. The doping concentration in the implanted region may be from about $3.0 \times 10^{19}$ atoms/cm$^3$ to about $3.0 \times 10^{21}$ atoms/cm$^3$, while lesser and greater doping concentrations are also contemplated herein.

Subsequently, the dopants in the first-side epitaxial semiconductor region 36, the second-side epitaxial semiconductor region 38, and the dopant portion 80 can be activated by, for example, laser anneal. The additional dopants in the second-side epitaxial semiconductor region 38 modify the characteristics of the second-side epitaxial semiconductor region 38 such as reducing the resistance and increasing the overlapping between the second-side epitaxial semiconductor region 38 and the gate structure (22, 24, 26, 28).

In another embodiment, the implanted ions are dopants having the opposite doping type as the first-side epitaxial semiconductor region 36. In one embodiment, the dopants in the first-side epitaxial semiconductor region 36 are p-type and the implanted dopants in the second-side epitaxial semiconductor region 38 and the dopant portion 80 are n-type. In another embodiment, the dopants in the first-side epitaxial semiconductor region 36 are n-type and the implanted dopants in the second-side epitaxial semiconductor region 38 and the dopant portion 80 are p-type. The doping concentration in the implanted regions (i.e., the second-side epitaxial semiconductor region 38 and the dopant portion 80) is higher than the doping concentration in the first-side epitaxial semiconductor region 36. In one embodiment, the doping concentration in the implanted regions is 1.5 to 3 times of the doping concentration in the first-side epitaxial semiconductor region 36, while lesser and greater doping concentrations are also contemplated herein.

Besides ion implantation, other doping techniques such as plasma doping, gas phase doping, liquid phase doping, solid phase doping can also be used to add additional dopants in the second-side epitaxial semiconductor region 38 and the portion of the semiconductor fin 16 surrounding the second-side epitaxial semiconductor region 38.

The first-side epitaxial semiconductor region 36 becomes the first epitaxial source/drain region 236. The second-side epitaxial semiconductor region 38 and the dopant portion 80 collectively constitute the second epitaxial source/drain region 238.

In the second embodiment of the present application, by implanting extra dopants through the second-side contact opening 52 into the second-side epitaxial semiconductor region 38 and the portion of the semiconductor fin 16 surrounding the second-side epitaxial semiconductor region 38, asymmetric junction profiles for the first epitaxial source/drain region 236 and the second epitaxial source/drain region 238 are created. The second epitaxial source/drain region 238 have a larger dimension which can provide an increased junction overlap with the gate stack (22, 24, 26) compared to the first epitaxial source/drain region 236 having a smaller dimension.

Figure 15:
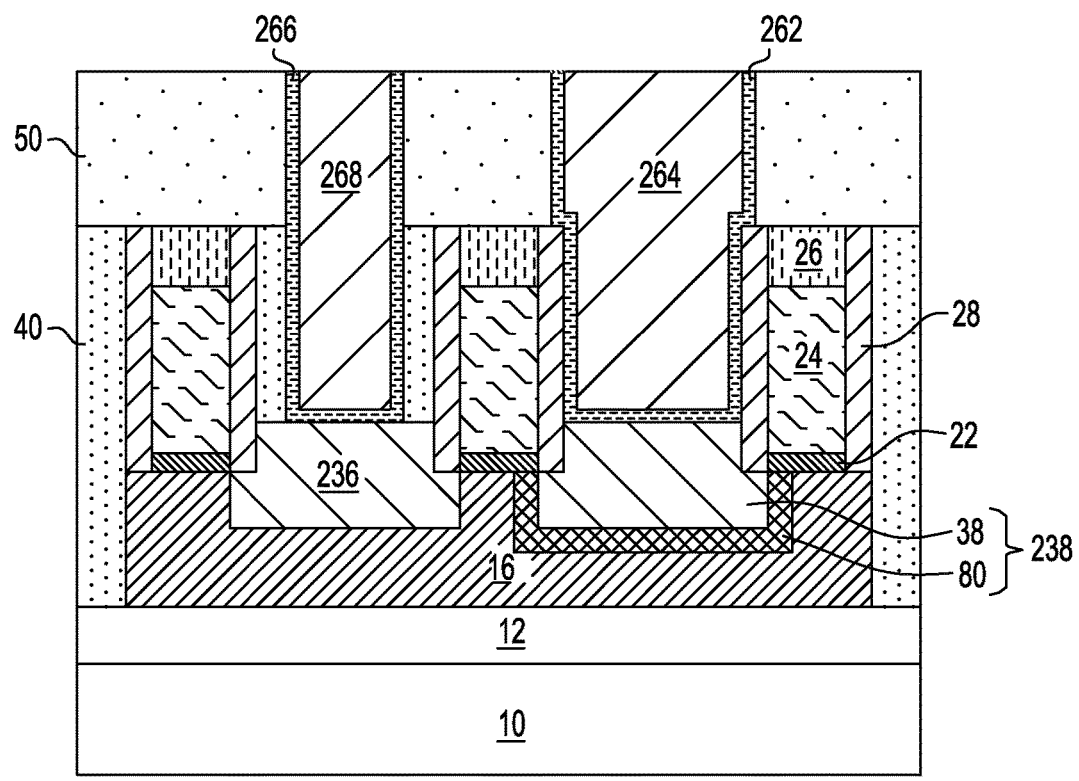
FIG. 15 is a cross-sectional view of the second exemplary semiconductor structure of FIG. 14 after forming a first-side contact structure within the first-side contact opening and a second-side contact structure within the second-side contact opening.

Referring to FIG. 15, a first-side contact structure including a first-side contact liner 266 and a first-side contact plug 268 is formed within a first-side contact opening (not shown) and a second-side contact structure including a second-side contact liner 262 and a second-side contact plug 264 is formed within the second-side contact opening 52 employing the processing steps described above in FIGS. 10-11 or the processing steps described above in FIGS. 12-13. The first-side contact liner 266 may include a conductive material the same as or different from the conductive material of the second-side contact liner 262. The first-side contact plug 268 may include a conductive material the same as or different from the conductive material of the first-side contact plug 264.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A method of forming a semiconductor structure comprising:
   forming a first-side trench on a first side of a gate structure and a second-side trench on a second side of the gate structure opposite to the first side by recessing portions of a semiconductor portion located on a substrate;
   forming a first-side epitaxial semiconductor region in the first-side trench and a second-side epitaxial semiconductor region in the second-side trench, wherein the first-side epitaxial semiconductor region and the second-side epitaxial semiconductor region comprise first dopants of a first conductivity type;
   forming at least one dielectric layer over the first-side epitaxial semiconductor region, the second-side epitaxial semiconductor region and the gate structure;
   forming a second-side contact opening through the at least one dielectric layer to expose an entire top surface of the second-side epitaxial semiconductor region while the first-side epitaxial semiconductor region remains covered by the at least one dielectric layer; and
   introducing second dopants into the second-side epitaxial semiconductor region and a portion of the semiconductor portion surrounding the second-side epitaxial semiconductor region to form a dopant region within the semiconductor portion.

2. The method of claim 1, wherein the introducing the second dopants into the second-side epitaxial semiconductor region and the portion of the semiconductor portion surrounding the second-side epitaxial semiconductor region is performed by ion implantation at an angle from 60° to 85° relative to the top surface of the second-side epitaxial semiconductor region.

3. The method of claim 1, wherein the second dopants have a conductivity type the same as or opposite from the first conductivity type.

4. The method of claim 1, wherein the first-side epitaxial semiconductor region and the second-side epitaxial semiconductor region are formed by selective epitaxy.

5. The method of claim 1, wherein the first-side epitaxial semiconductor region and the second-side epitaxial semiconductor region are in-situ doped with the first dopants of the first conductivity type.

6. The method of claim 1, wherein each of the first-side epitaxial semiconductor region and the second-side epitaxial semiconductor region comprises silicon, silicon germanium, silicon carbon, silicon germanium carbon, a compound semiconductor material, or an alloy thereof.

7. The method of claim 1, wherein the gate structure comprises a gate stack located on a channel portion of the semiconductor portion and a gate spacer located on each sidewall of the gate stack.

8. The method of claim 7, wherein the gate stack comprises a gate dielectric, a gate electrode and a gate cap.

9. The method of claim 7, wherein a sidewall of the lower portion of each of the first-side epitaxial semiconductor region and the second-side epitaxial semiconductor region is vertically coincident with an inner sidewall of each gate spacer.

10. The method of claim 7, wherein the dopant region is in direct contact with a bottommost surface of the gate stack.

11. The method of claim 7, wherein the forming the first-side trench and the second-side trench comprises:
    vertically recessing the portions of the semiconductor portion that are not covered by the gate structure; and
    laterally recessing portions of the semiconductor portion that are located beneath the gate structure such that sidewalls of the first trench and the second trench are offset from the outer sidewalls of the gate spacers.

12. The method of claim 11, wherein an anisotropic etch is performed to vertically recess the portions of the semiconductor portion that are not covered by the gate structure, and wherein an isotropic etch is performed to laterally recess portions of the semiconductor portion that are located beneath the gate structure.

13. The method of claim 1, wherein the dopant region is U-shaped and surrounds a lower portion of the second-side epitaxial semiconductor region.

14. The method of claim 1, wherein the forming the at least one dielectric layer over the first-side epitaxial semiconductor region, the second-side epitaxial semiconductor region and the gate structure comprises:
    forming an interlevel dielectric (ILD) layer over the first-side epitaxial semiconductor region, the second-side epitaxial semiconductor region and the gate structure;
    planarizing the ILD layer such that a top surface of the ILD layer is coplanar with a topmost surface of the gate structure; and
    forming a contact level dielectric layer over the ILD layer and the gate structure.

15. The method of claim 1, further comprising forming a first-side contact structure that is in contact with at least a portion of a top surface of the first-side epitaxial semiconductor region and a second-side contact structure that is in contact with an entire top surface of the second-side epitaxial semiconductor region.

16. The method of claim 15, wherein the first-side contact structure comprises a first-side contact liner and a first-side contact plug, and the second-side contact structure comprises a second-side contact liner and a second-side contact plug.

17. The method of claim 16, wherein the first-side contact liner comprises an electrically conductive material the same as, or different from the second-side contact liner, and the first-side contact plug comprises an electrically conductive material the same as, or different from the second-side contact liner plug.

18. The method of claim 15, wherein the forming the first-side contact structure and the second-side contact structure comprises:
    forming a contact liner material layer on sidewalls and a bottom surface of the second-side contact opening and a topmost surface of the at least one dielectric layer;
    forming a contact conductor layer to completely fill the second-side contact opening;
    removing portions of the contact liner material layer and the contact conductor layer that are located above the topmost surface of the at least one dielectric layer to provide the second-side contact structure;
    forming a first-side contact opening through the at least one dielectric layer to expose at least a portion of the top surface of the first-side epitaxial semiconductor region while the second-side contact structure is covered by a patterned mask layer;
    removing the patterned mask layer;
    forming another contact liner material layer on sidewalls and a bottom surface of the first-side contact opening and a topmost surface of the at least one dielectric layer;
    forming another contact conductor layer to completely fill the first-side contact opening; and
    removing portions of the another contact liner material layer and the another contact conductor layer that are located above the topmost surface of the at least one dielectric layer to provide the first-side contact structure.

19. The method of claim 15, wherein the forming the first-side contact structure and the second-side contact structure comprises:
    forming a first-side contact opening through the at least one dielectric layer to expose at least a portion of the top surface of the first-side epitaxial semiconductor region while the second-side contact opening is covered by a patterned mask layer;
    removing the patterned mask layer to re-expose the second-side contact opening;
    forming a contact liner material layer on sidewalls and bottom surfaces of the first-side contact opening and the second-side contact opening and a topmost surface of the at least one dielectric layer;
    forming a contact conductor layer to completely fill the first-side contact opening and the second-side contact opening; and
    removing portions of the contact liner material layer and the contact conductor layer that are located above the topmost surface of the at least one dielectric layer to provide the first-side contact structure and the second-side contact structure.

20. The method of claim 1, wherein the semiconductor portion is a semiconductor fin formed by patterning a top semiconductor layer of a semiconductor-on-insulator (SOI) substrate including a handle substrate, a buried insulator layer present on the handle substrate and the top semiconductor layer present on the buried insulator layer.

* * * * *